(12) United States Patent
Kaneko et al.

(10) Patent No.: US 8,198,894 B2
(45) Date of Patent: Jun. 12, 2012

(54) HIGH FREQUENCY MAGNETIC FIELD COIL AND MAGNETIC RESONANCE IMAGING APPARATUS WITH THE SAME

(75) Inventors: Yukio Kaneko, Kawaguchi (JP); Hideta Habara, Musashino (JP); Yoshihisa Soutome, Tokyo (JP); Yosuke Otake, Kokubunji (JP); Yoshitaka Bito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 422 days.

(21) Appl. No.: 12/417,852

(22) Filed: Apr. 3, 2009

(65) Prior Publication Data
US 2009/0251145 A1    Oct. 8, 2009

(30) Foreign Application Priority Data
Apr. 4, 2008 (JP) ................................. 2008-097735

(51) Int. Cl.
G01V 3/00 (2006.01)
(52) U.S. Cl. ........ 324/318; 324/314; 324/313; 324/311; 324/309; 324/307
(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| 2,693,525 A | * | 11/1954 | Kendall et al. | 246/124 |
| 3,103,623 A | * | 9/1963 | Greenwood, Jr | 324/302 |
| 3,103,624 A | * | 9/1963 | Greenwood, Jr et al. | 324/302 |
| 3,371,270 A | * | 2/1968 | Servoz-Gavin et al. | 324/301 |
| 3,396,329 A | * | 8/1968 | Salvi | 324/301 |
| 4,620,155 A | * | 10/1986 | Edelstein | 324/322 |
| 6,636,040 B1 | * | 10/2003 | Eydelman | 324/318 |
| 7,084,630 B2 | * | 8/2006 | Ludwig et al. | 324/318 |
| 7,088,104 B2 | * | 8/2006 | Bottomley | 324/328 |
| 7,639,012 B2 | * | 12/2009 | Habara et al. | 324/318 |
| 7,714,581 B2 | * | 5/2010 | Erickson et al. | 324/322 |
| 7,844,319 B2 | * | 11/2010 | Susil et al. | 600/411 |

(Continued)

FOREIGN PATENT DOCUMENTS
JP      07-155307     6/1995

OTHER PUBLICATIONS

Dongfeng Lu and Peter M. Joseph, "A Technique of Double Resonant Operation of F-19 and H-1 Quadrature Birdcage Coils," Abstracts of Society of Magnetic Resonance in Medicine, p. 531, 1990, and JP-A-Hei7(1995)-155307).

(Continued)

*Primary Examiner* — Melissa Koval
*Assistant Examiner* — Tiffany Fetzner
(74) *Attorney, Agent, or Firm* — Antonelli, Terry, Stout & Kraus, LLP.

(57) ABSTRACT

An RF coil for MR Imaging that can change a resonance frequency easily and instantaneously in response to a nuclide to be imaged without exchange and adjustment and that also causes only small lowering of sensitivity. The RF coil has a sub coil for changing a resonance frequency of the transmitting/receiving RF coil for transmitting and receiving an MR signal between itself and a nuclide that is an object to be imaged. The sub coil is equipped with a switch, and at the time of switching-on, shifts the resonance frequency of the RF coil by changing an inductance value of the RF coil in a noncontact manner using inductance coupling.

16 Claims, 12 Drawing Sheets

U.S. PATENT DOCUMENTS

| | | | |
|---|---|---|---|
| 7,912,531 B1* | 3/2011 | Chiu et al. | 600/423 |
| 7,916,920 B2* | 3/2011 | Seifert et al. | 382/131 |
| 2003/0050557 A1* | 3/2003 | Susil et al. | 600/424 |
| 2006/0265049 A1* | 11/2006 | Gray et al. | 623/1.16 |
| 2007/0088416 A1* | 4/2007 | Atalar et al. | 607/115 |
| 2007/0279061 A1* | 12/2007 | Erickson et al. | 324/322 |
| 2008/0119919 A1* | 5/2008 | Atalar et al. | 607/116 |
| 2008/0315880 A1* | 12/2008 | Habara et al. | 324/318 |
| 2009/0251145 A1* | 10/2009 | Kaneko et al. | 324/318 |
| 2010/0117642 A1* | 5/2010 | Zhai et al. | 324/307 |
| 2010/0166279 A1* | 7/2010 | Seifert et al. | 382/131 |
| 2010/0277168 A1* | 11/2010 | Luedeke | 324/307 |
| 2011/0121834 A1* | 5/2011 | Soutome et al. | 324/318 |

OTHER PUBLICATIONS

Gerald B. Matson et al., "A Practical Double-Tuned 1 H/31 P Quadrature Birdcage Headcoil Optimized for 31P Operation," Magnetic Resonance in Medicine, pp. 173-182, 1999).

* cited by examiner

HIGH FREQUENCY MAGNETIC FIELD COIL AND MAGNETIC RESONANCE IMAGING APPARATUS WITH THE SAME

CLAIM OF PRIORITY

The present application claims priority from Japanese patent application JP 2008-097735 filed on Apr. 4, 2008, the content of which is hereby incorporated by reference into this application.

FIELD OF THE INVENTION

The present invention relates to a high frequency (radio frequency: RF) coil for transmitting and receiving a magnetic resonance (MR) signal of a magnetic resonance imaging (MRI) apparatus. More specifically, the present invention relates to an RF coil capable of detecting MR signals from a plurality of nuclides.

BACKGROUND OF THE INVENTION

The MRI apparatus irradiates a high frequency wave on a body under examination (hereafter referred to as the subject) placed in a uniform static magnetic field to excite nuclear spins inside the subject, receives MR signals generated by the nuclear spins, and renders an image of the subject (imaging). Irradiation of the high frequency wave and reception of the MR signals are conducted by a resonance type RF coil.

Generally, in imaging by the MRI apparatus, an MR signal of hydrogen nuclide ($^1$H) is used. However, these days, there is multinuclear imaging whereby MR signals from plural kinds of nuclides, such as fluorine ($^{19}$F), phosphorus ($^{31}$P), and sodium ($^{23}$Na), in addition to hydrogen nucleus, are detected and are put into images. The multinuclear imaging is used in the case where an in-body distribution of a component nuclide contained inside the body other than hydrogen is intended to be grasped, in the case where a contrast medium having fluoride is intended to be visualized, and the like.

In the multinuclear imaging, when MR signals from plural kinds of nuclides are detected with a resonance type RF coil, the resonance frequencies of the RF coil must be tuned in to frequencies of the MR signals of the respective nuclides. For example, in the case where an MRI apparatus of 3T imaging two kinds of nuclides, hydrogen and fluoride, the resonance frequency of the RF coil is tuned in to 127.8 MHz for hydrogen and to 120.3 MHz for fluoride, respectively.

For this reason, the multinuclear imaging uses the following two methods: a plurality of RF coils having different resonance frequencies that are tuned in to respective frequencies of the MR signals of a plurality of nuclides that are intended to be detected; and a single RF coil capable of changing the resonance frequency in response to the nuclide to be detected. The RF coil that is used in imaging in which two kinds of nuclides are considered as objects to be detected, which is a main stream in the multinuclear imaging, and that is capable of changing the resonance frequency includes: (1) A coil utilizing a fact that a birdcage type RF coil has a plurality of resonance modes (e.g., see Gerald B. Matson et al., "A Practical Double-Tuned 1H/31 P Quadrature Birdcage Headcoil Optimized for 31P Operation," Magnetic Resonance in Medicine, pp. 173-182, 1999); (2) A coil changing its resonance frequency using a variable capacitor; (3) A coil changing its resonance frequency by an arrangement of a capacitor and an inductor (a double tunable RF coil); (4) A coil changing its resonance frequency by varying the distance between an RF shield and the RF coil (e.g., see Dongfeng Lu and Peter M. Joseph, "A Technique of Double Resonant Operation of F-19 and H-1 Quadrature Birdcage Coils," Abstracts of Society of Magnetic Resonance in Medicine, p. 531, 1990, and JP-A-Hei7(1995)-155307); etc.

SUMMARY OF THE INVENTION

However, when using a different RF coil for every nuclide that is an object to be detected, time and manpower are necessary to exchange the RF coil, and there is a possibility that a shift of a point of the subject etc. may occur at the time of exchange. On the other hand, in a coil that uses a characteristic of a birdcage type RF coil, interference takes place in the case where values of resonance frequencies are near to each other. For this reason, there is a restriction in a combination of nuclides that are objects to be detected. Moreover, since the coil is restricted to be of the birdcage type, there is also a restriction in a coil form. For a coil that changes the resonance frequency by a variable capacitor, the capacitor needs to be adjusted each time the nuclide that is the object to be detected is changed. Moreover, the double tunable RF coil has a low sensitivity compared with the coil having a single resonance frequency. A coil that is adjusted by a distance to the RF shield not only needs to be adjusted each time the nuclide that is the object to be detected is changed but also may require a large-sized complex adjustment mechanism.

The present invention is made in consideration of the above-mentioned circumstances, and has an object to provide an RF coil that is used in imaging in which MR signals of two kinds of nuclides are designated as objects to be detected in the multinuclear imaging and that does not need exchange and adjustment of itself for each object nuclide and yet suffers small lowering in sensitivity.

The RF coil of the present invention is equipped with a sub coil having a switch that performs inductance coupling mutually with an RF coil at the time of switching-on. By means of inductance coupling, an inductance value of the RF coil is changed and the resonance frequency of the RF coil is shifted.

Specifically, provided is a high frequency magnetic field coil of a magnetic resonance imaging apparatus whose resonance frequency is a magnetic resonant frequency of a first nuclide and that has a sub coil, wherein the sub coil is equipped with a conduction control unit for controlling conduction of itself, is disposed at a point at which it can magnetically couple with the high frequency magnetic coil, and at the time of conduction, modifies the resonance frequency of the high-frequency magnetic field coil to be a magnetic resonant frequency of a second nuclide that has a higher second frequency than the magnetic resonant frequency of the first nuclide.

According to the present invention, an RF coil that is used in imaging in which MR signals of the two kinds of nuclides are designated as objects to be detected in multinuclear imaging and that does not need exchange and adjustment of itself for the each object nuclide also with slight lowering in sensitivity can be obtained.

DETAILED DESCRIPTION OF THE PREFERRED EMBODIMENTS

First Embodiment

Figure 1:
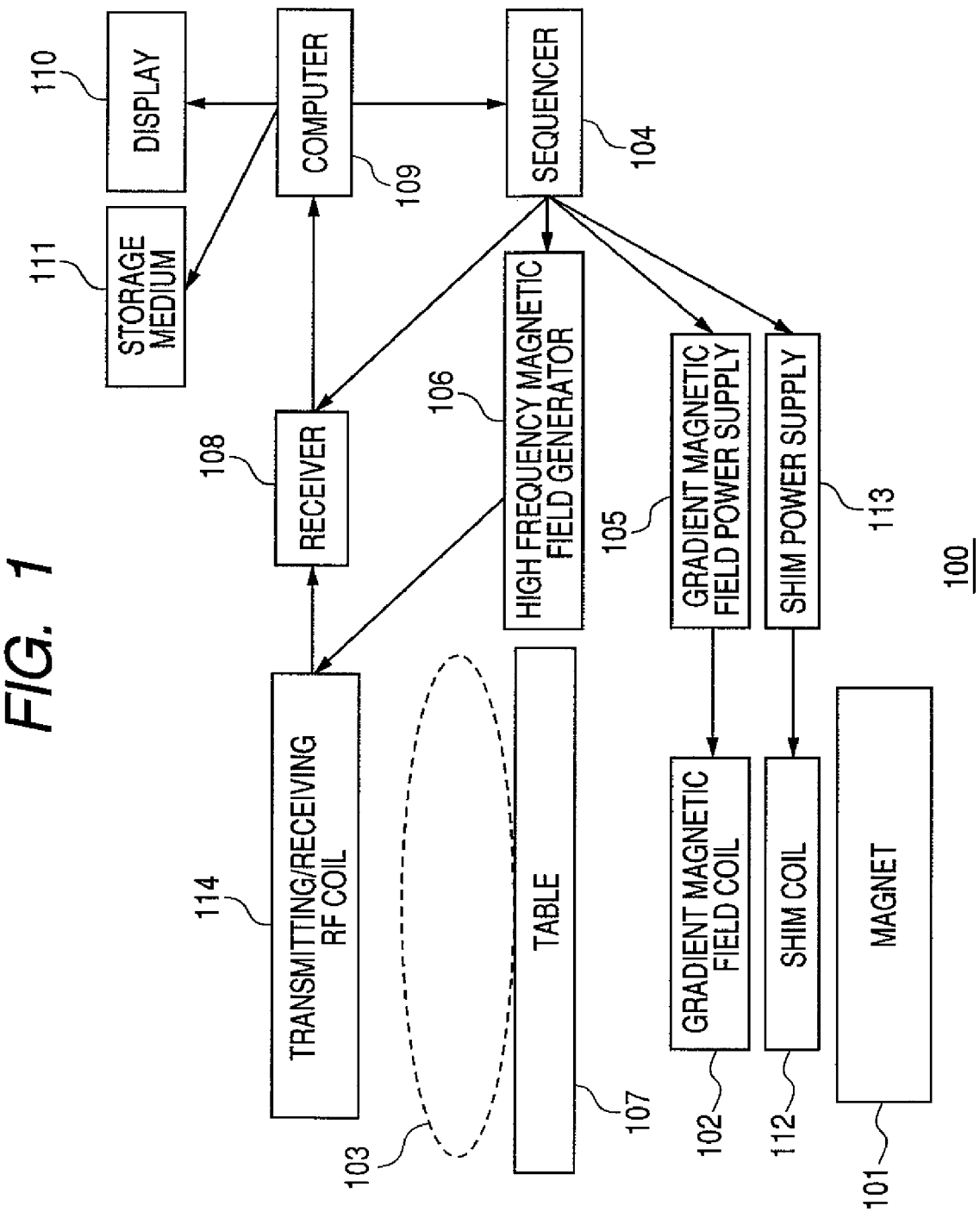
FIG. 1 is a block diagram of an MRI apparatus of a first embodiment.

Hereafter, a first embodiment of the present invention will be described. First, an entire configuration of an MRI apparatus of the first embodiment will be explained. FIG. 1 is a block diagram of an MRI apparatus 100 of this embodiment. As shown in this figure, the MRI apparatus 100 of this embodiment comprises a magnet 101 for generating a static magnetic field, a coil 102 for generating a gradient magnetic field, a shim coil 112 for adjusting a uniformity coefficient of the static magnetic field, a sequencer 104, a transmitting/receiving RF coil 114 for generating a high frequency magnetic field, and a table 107 on which a subject 103 is placed and held. The gradient magnetic field coil 102 and the shim coil 112 are connected to a gradient magnetic field power supply 105 and a shim power supply 113, respectively. The transmitting/receiving RF coil 114 is connected to a high frequency magnetic field generator 106 and a receiver 108. The sequencer 104 sends commands to the gradient magnetic field power supply 105, the shim power supply 113, and the high frequency magnetic field generator 106, and makes them generate the gradient magnetic field and the high frequency magnetic field, respectively. The high frequency magnetic field is impressed to the subject 103 through the transmitting/receiving RF coil 114. The RF signal generated from the subject 103 by impressing the high frequency magnetic field is detected by the transmitting/receiving RF coil 114, and undergoes detection in the receiver 108. The magnetic resonant frequency that serves as a reference of detection in the receiver 108 is set up by a computer 109 via the sequencer 104. The detected signal is sent to the computer 109 via an A/D converter, and is subjected to signal processing, such as image reconstruction, here. The result is displayed on a display 110. The detected signals and measurement conditions are saved in a storage medium 111 if needed. The sequencer 104 usually controls so that each device may operate at timings and intensities that were programmed in advance.

In the transmitting/receiving RF coil 114 of this embodiment, its resonance frequency changes so as to tune in to the MR signal of the nuclide in response to the nuclide to be imaged. Below, a principle of the changeover will be explained.

Generally, the resonance frequency f of the coil whose equal circuit is expressed by a resonance circuit having a capacitor (its capacitance is denoted by C) and an inductance (its value is denoted by L) is expressed by the following formula (1):

$$f \propto (LC)^{-1/2} \qquad (1)$$

Therefore, the resonance frequency f of the coil can be changed by changing a value of the inductance L or a capacitance of the capacitor C.

The transmitting/receiving RF coil 114 of this embodiment realizes changeover of the resonance frequency f by altering the value of inductance L and thereby changing the resonance frequency. The value of inductance L is changed by means of inductance coupling between itself and the coil disposed in its neighborhood.

Figure 2:
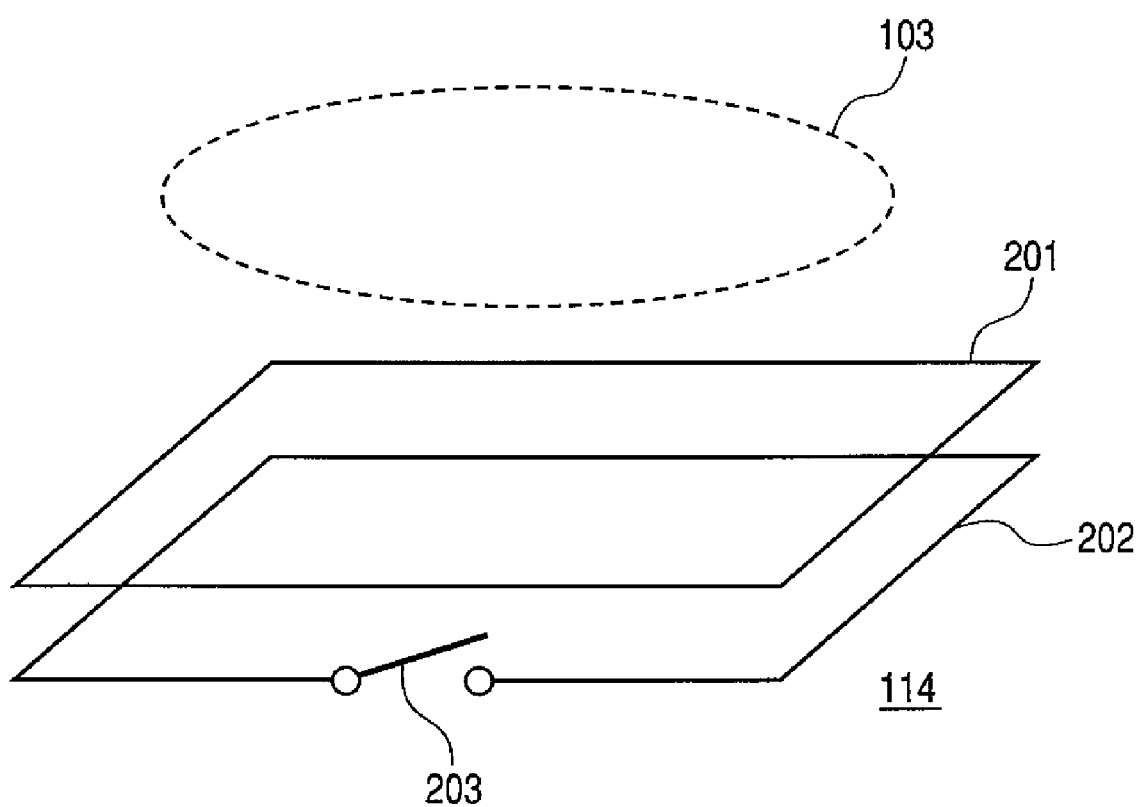
FIG. 2 is a configuration diagram of a transmitting/receiving RF coil of the first embodiment.

FIG. 2 shows a fundamental configuration of the transmitting/receiving RF coil 114 of this embodiment. The transmitting/receiving RF coil 114 of this embodiment is equipped with a first coil 201 for transmitting and receiving a magnetic resonance signal and a second coil 202 for changing a resonance frequency of the first coil 201. The second coil 202 has a switch 203 and is disposed at a point at which it can magnetically couple with the first coil 201 (a point at which their inductances are coupled mutually). When a current flows in the first coil 201, an induced current will arise in the second coil 202 and the second coil 202 will form magnetic flux. Because of this influence, the inductance of the first coil 201 becomes small.

Turning ON and OFF of the inductance coupling is performed by ON-OFF of the switch 203. When the switch 203 is turned ON and a current flows in the second coil 202, the inductance coupling will take place, which will reduce the inductance L of the first coil 201. Accompanying with it, a resonance frequency f1 shifts to a higher frequency f1'. When the switch 203 is turned OFF, no current flows in the second coil 202, and consequently inductance coupling is canceled and the inductance L of the first coil 201 returns to an initial value. Along with it, the resonance frequency f1' also returns to the initial resonance frequency f1.

This embodiment uses the conventional RF coil whose resonance frequency f1 is adjusted so as to tune in to the MR signal of a previously determined nuclide for the first coil 201. The resonance frequency f1 of the first coil 201 is adjusted so as to tune in to a lower frequency of the MR signal frequencies of the two kinds of nuclides that are to be detected. When the inductance coupling takes place, a relation between the first coil 201 and the second coil 202 is adjusted so that the resonance frequency f1 may tune in to a higher one (resonance frequency f1') of the frequencies of the MR signals of the two kinds of nuclides that are to be detected.

The adjustment is conducted by changing a distance of the second coil 202 from the first coil 201 and/or a size of the second coil 202 with respect to the first coil 201. Since the smaller the distance between the two coils, the larger the effect of the inductance coupling becomes. Therefore, the amount of change of the inductance L of the first coil 201 and the shift amount of the resonance frequency become larger under such a circumstance. Moreover, regarding the size of the second coil 202, when it is of a comparable size to the first coil 201, the inductance coupling is performed most efficiently and the amount of change of the inductance L and the shift amount of the resonance frequency become larger. Using these properties, the distance of the two and the size of the second coil 202 are appropriately set up and the resonance frequency f1' is adjusted. Incidentally, the resonance frequency f1' can also be adjusted using a thickness of lead wire of the second coil 202 etc. other than the distance and the size. These adjustments are conducted at the time of production or installation of the transmitting/receiving RF coil 114.

Incidentally, FIG. 2 shows a case where the second coil 202 is the same size as the first coil 201 and is disposed at a point facing the subject 103 via the first coil 201, as one example. In addition, a case where the first coil 201 and the second coil 202 are not electrically connected together is shown as one example.

Figure 3:
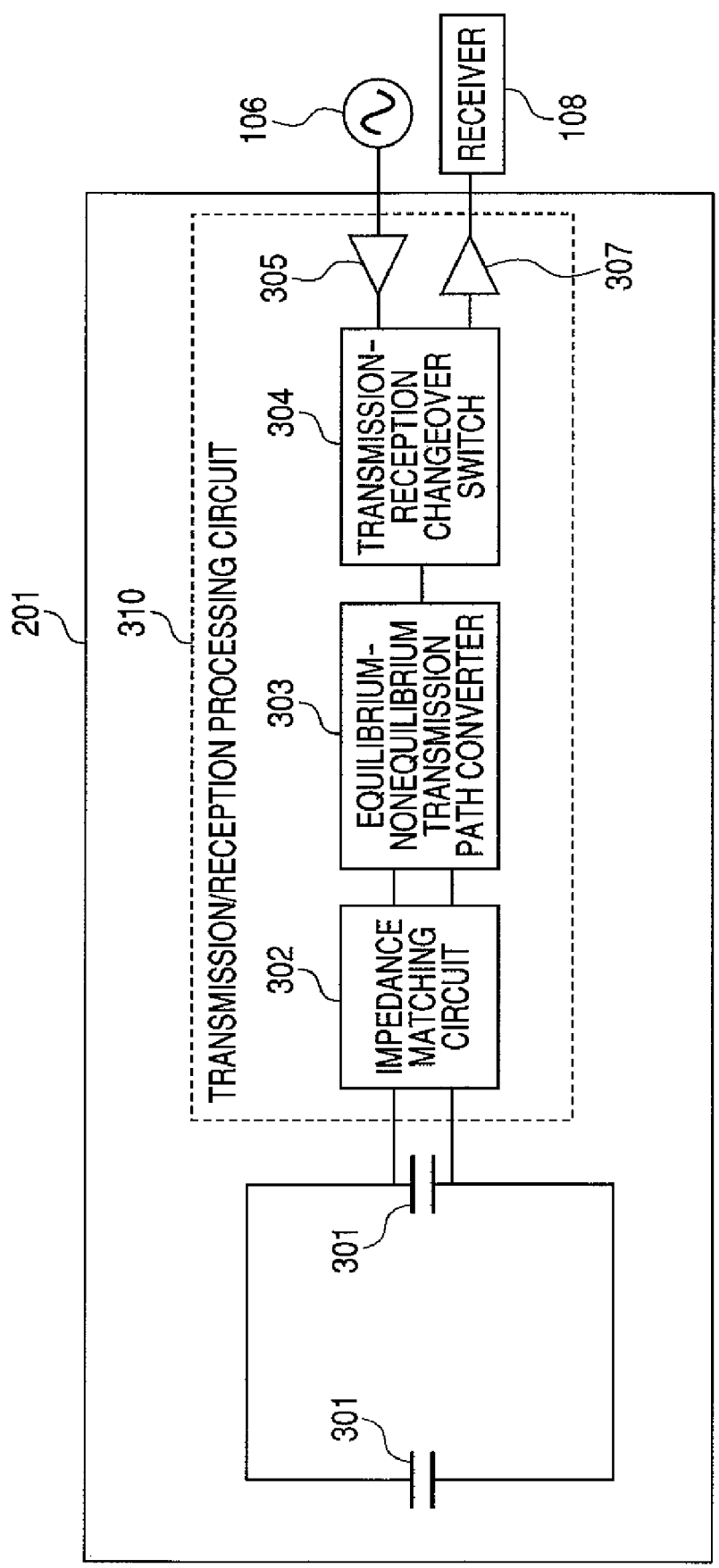
FIG. 3 is a circuit diagram of a first coil of the first embodiment.

Next, examples of circuits of the first coil 201 and of the second coil 202 will be explained, respectively. The first coil 201 is a serial or parallel resonant circuit such that its inductance L varies by the second coil 202 that is electrically non-contacted to the first coil 201, and a normal RF coil can be used for it, as described above. FIG. 3 is an example of the circuit of the first coil 201 of this embodiment. As shown in this figure, the first coil 201 is equipped with at least one capacitor 301 in its loop part. Moreover, the first coil 201 is equipped with a transmitting or receiving circuit (transmission/reception processing circuit) 310 that is connected to at least one end of the capacitor 301. The transmission/reception processing circuit 310 is equipped with an impedance matching circuit 302 that converts the impedance so that it may be matched to that of coaxial cable etc. and an equilibrium-nonequilibrium transmission path converter 303, a transmission-reception changeover switch 304, a pre-amplifier 307, and a power amplifier 305. When the transmission-reception changeover switch 304 is turned to a transmission side, a signal transmitted by the high frequency magnetic field generator (waveform generating device) 106 is amplified by the power amplifier 305, and is supplied to the first coil 201. When the transmission-reception changeover switch 304 is turned to a reception side, the signal detected by the first coil 201 is amplified by the pre-amplifier 307, and is detected by the receiver 108.

Figure 4:
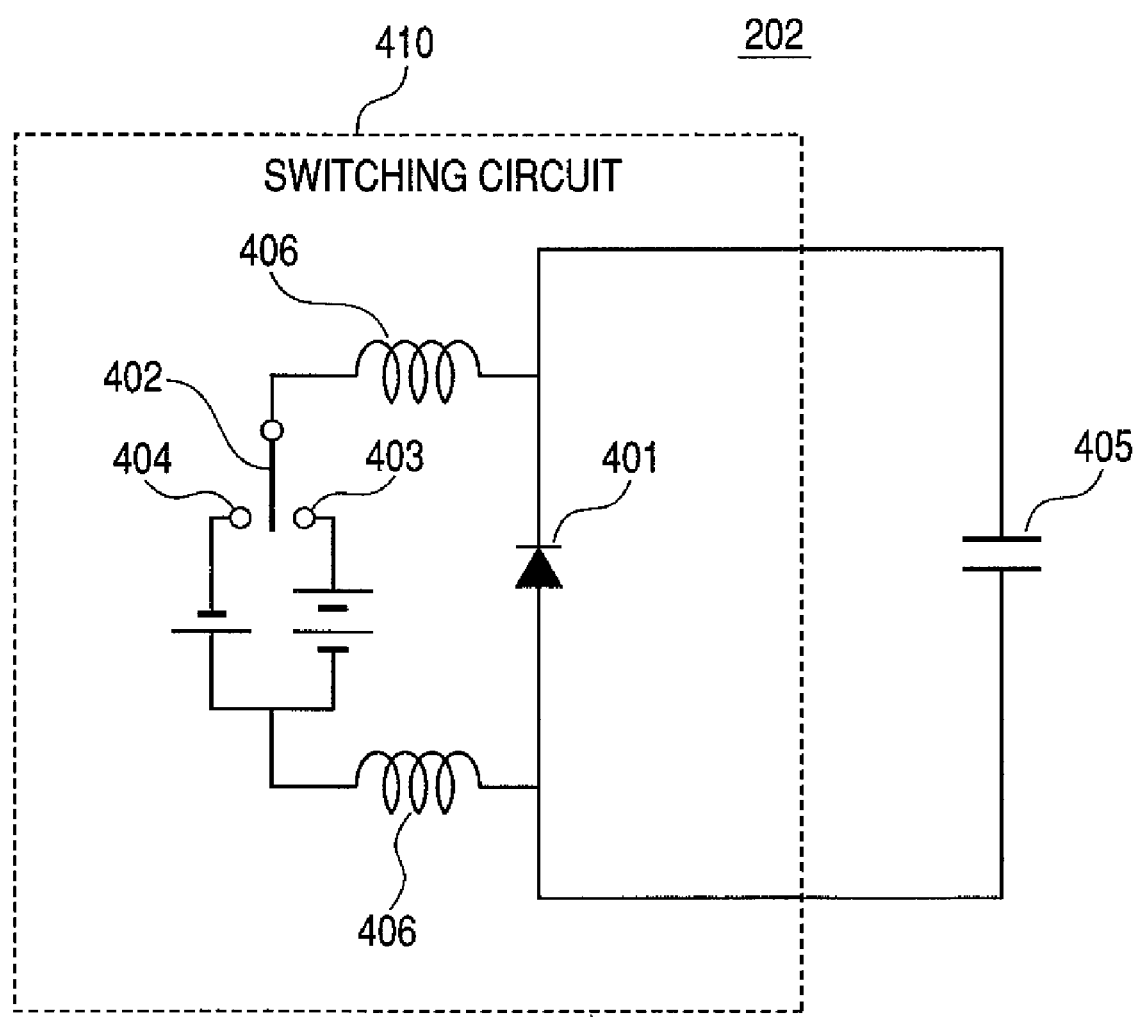
FIG. 4 is a circuit diagram of a second coil of the first embodiment.

The second coil 202 has a switch 203 that is configured to be able to generate two states between itself and the first coil 201 that is electrically non-connected thereto: a state where inductances of the two coils are coupled mutually; and a state other than the above state. FIG. 4 shows an example of the circuit of the second coil 202. The second coil 202 is equipped with a diode 401 and a capacitor 405 in its loop part. A switching circuit 410 that acts as the switch 203 along with the diode 401 is connected to the diode 401. The switching circuit 410 has the diode 401, a changeover switch 402, terminals 403, 404, and an inductor 406, and is configured so that, when the changeover switch 402 is turned to the terminal 403 side, a reverse voltage may be impressed to the diode 401, and when it is turned to the terminal 404 side, a forward voltage may be impressed to the diode 401. Therefore, when the changeover switch 402 is turned to the terminal 403 side, the switch circuit 410 becomes a state where no current flows in the loop part, and when it is turned to the terminal side 404 side, a current flows in the loop part. The inductor 406 is provided in order to prevent the RF component from entering into power supplies.

Incidentally, the capacitor 405 is inserted in order to cut a direct current (DC) of the loop part and to permit only an RF component to flow. It is necessary to prevent the DC of the loop part in the second coil 202 from disturbing a magnetic field around it. Incidentally, for the capacitor 405, a capacitor that has a capacitance larger than several hundreds pF is used. By this specification, the loop part of the second coil 202 becomes low impedance in the RF bandwidth, and becomes high impedance to DC, so that no current flows in it.

In addition, the switching circuit 410 that realizes the switch 203 may be replaced by a mechanical switching circuit that uses a technology, such as MEMS (micro-electro-mechanical system). Alternatively, the switch circuit may be configured so as to obtain the same effect as ON-OFF of the switch may be obtained by inserting a variable resistor in the loop part of the second coil 202 and by changing the value of the resistor.

As explained above, according to this embodiment, when detecting two kinds of nuclides, it is not necessary to adjust the transmitting/receiving RF coil 114 for each nuclide that is an object to be detected. Moreover, at the time of detecting a nuclide whose MR signal has a lower frequency, since the first coil 201 that is substantially the conventional transmitting/receiving RF coil will be used as it is, there is no concern about lowering of sensitivity. In addition, at the time of detecting a nuclide whose MR signal has a higher frequency, a large influence is not exerted on the sensitivity as the transmitting/receiving RF coil 114, either. Moreover, since the shift amount of the resonance frequency on the first coil 201 side can be adjusted by the distance between itself and the second coil and the size of the second coil, the transmitting/receiving RF coil 114 does not place any restriction on a shift range of the resonance frequency. For this reason, the transmitting/receiving RF coil can support detection of the two kinds of nuclides whose MR signals are close to each other in frequency. Moreover, the nuclide that is the object to be detected can be changed by ON-OFF of the second coil 202 side, the resonance frequency of the RF coil can be changed easily and instantaneously between the resonance frequencies of the two kinds of nuclides in response to the nuclide to be imaged. In addition, it is not necessary to remove the transmitting/receiving RF coil 114 at each time of nuclide change. Therefore, since a relative distance between the subject and the transmitting/receiving RF coil 114 does not change, high accuracy of position is kept at the time of comparison between images of different nuclides.

Therefore, according to the transmitting/receiving RF coil 114 of this embodiment, the resonance frequency can be changed between the resonance frequencies of the two kinds of nuclides easily and instantaneously in response to the nuclide to be imaged, and imaging is possible with the relative position between the subject and the RF coil unchanged and with a high sensitivity, even when the nuclide is different.

Second Embodiment

Next, a second embodiment to which the present invention is applied will be described. A configuration of the transmitting/receiving RF coil 114 of this embodiment is fundamentally the same as that of the first embodiment. However, in this embodiment, the MRI apparatus side has a configuration that controls changeover of the switch of the transmitting/receiving RF coil 114. Below, this embodiment will be described, mainly focusing on its configuration different from that of a counterpart of the first embodiment. Any circuit, component, or the like that has the same configuration as that of the first embodiment is given the same reference numeral.

Figure 5:
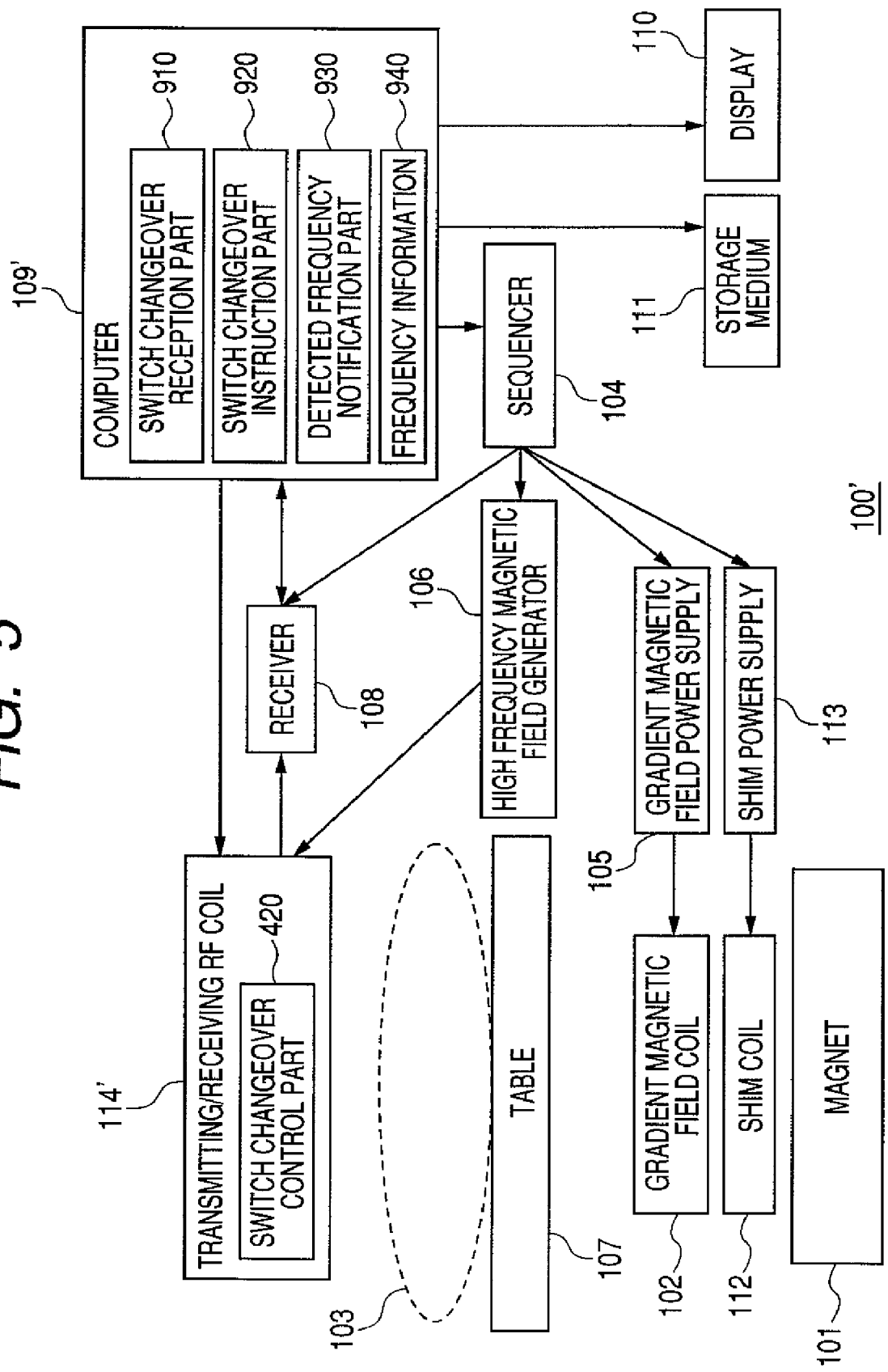
FIG. 5 is a functional block diagram of the MRI apparatus of a second embodiment.

FIG. 5 is a block diagram of an MRI apparatus 100' of this embodiment. As shown in this figure, the MRI apparatus 100' of this embodiment has fundamentally the same configuration as that of the MRI apparatus 100 of the first embodiment. However, a configuration of a computer 109' is different. The computer 109' of this embodiment has: a switch changeover reception part 910 for receiving an instruction of changeover of the switch 203; a switch changeover instruction part 920 that upon reception of the instruction of the changeover at the switch changeover reception part 910, transmits an instruction of changing over the switch 203 to the transmitting/receiving RF coil 114'; and a detected frequency notification part 930 that, when knowing that the switch changeover instruction part 920 transmitted the instruction of the changeover of the switch 203, discriminates the resonance frequency of the transmitting/receiving RF coil 114' after the changeover of the switch 203, determines the magnetic resonant frequency that serves as a reference of detection based on it, and informs the receiver 108 of it.

Moreover, in order to discriminate the resonance frequency after performing changing by the switch 203, the computer 109' maintains in advance information on the resonance frequency of the transmitting/receiving RF coil 114' of this embodiment when the switch 203 is ON and the resonance frequency thereof when being OFF (frequency information 940). The detected frequency notification part 930 discriminates the resonance frequency referring to the frequency information 940. The switch changeover reception part 910, the switch changeover instruction part 920, and the detected frequency notification part 930 are realized by programs maintained in advance in memory of the computer 109' etc. being executed by a CPU. Moreover, the switch changeover reception part 910 may be configured to be connected to a control part (not illustrated), including a mouse and a keyboard, and to receive an instruction from an operator via the control part.

Incidentally, the switch changeover instruction part 920 may be configured to receive the instruction to change the switch 203 from the sequencer 104. In this case, the switch changeover reception part 910 may be removed. Further, the sequencer 104 may be configured to notify the magnetic resonant frequency that is designated as a reference of detection to the receiver 108. In this case, the detected frequency notification part 930 may be removed.

The transmitting/receiving RF coil 114' of this embodiment has fundamentally the same configuration as that of the first embodiment, and is further equipped with a switch changeover control part 420. The switch changeover control part 420 receives the instruction of the changeover of the switch 203 from the computer 109', and changes the switch 203 of the second coil 202 from ON to OFF or from OFF to ON according to the received instruction.

Incidentally, the computer 109' of this embodiment may be configured to display the resonance frequency of the present transmitting/receiving RF coil 114' or the kind of a nuclide that will be detected by the present transmitting/receiving RF coil 114' on the display 110 in response to the instruction of the switch changeover instruction part 920.

Other configurations of the transmitting/receiving RF coil 114', the MRI apparatus 100', and others of this embodiment are the same as those of the above-mentioned first embodiment.

As explained above, according to this embodiment, like the first embodiment, there can be realized the transmitting/receiving RF coil 114 that can change its resonance frequency between the resonance frequencies of the two kinds of nuclides in response to a nuclide to be imaged easily and instantaneously, and can perform imaging with a relative point of the transmitting/receiving RF coil unchanged even when the nuclide is different and with a high sensitivity.

Further, according to this embodiment, the changeover of the resonance frequency of the transmitting/receiving RF coil 114' can be performed through the computer 109' of the MRI apparatus 100'. Therefore, the changeover of the resonance frequency of the transmitting/receiving RF coil 114' can be performed more easily.

Figure 6:
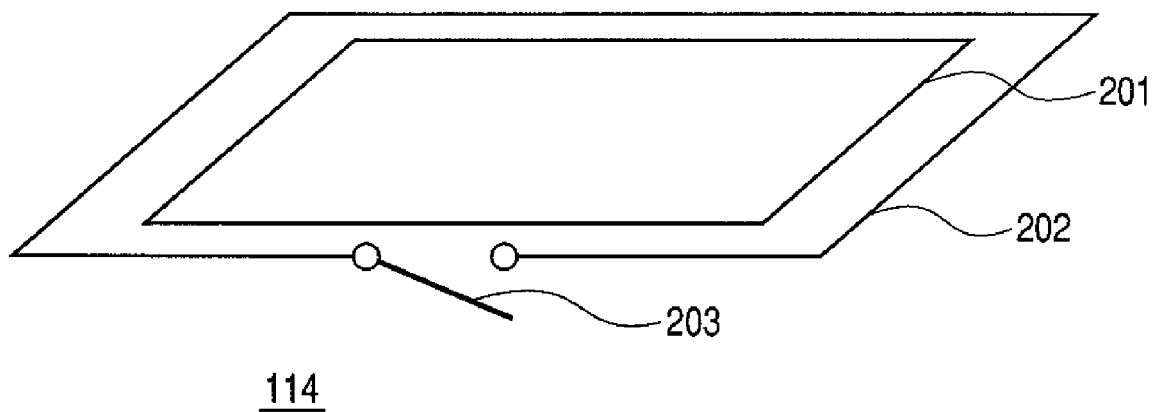
FIG. 6 is another block diagram of transmitting/receiving RF coil of the first and second embodiments.
Figure 7:
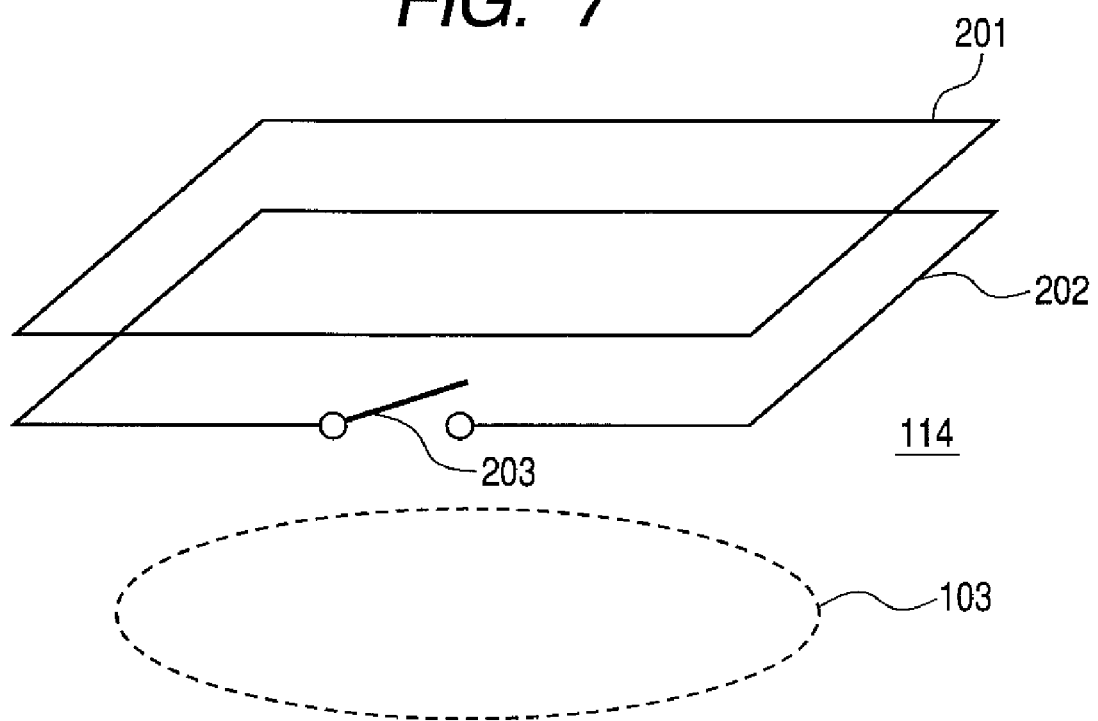
FIG. 7 is another configuration diagram of the transmitting/receiving RF coil of the first and second embodiments.

In each of these above-mentioned embodiments, the cases in each of which the second coil 202 is the same size as that of the first coil 201 and is at the point facing the subject 103 through the first coil 201 were illustrated by an example and explained. However, a relationship between positions of the first coil 201 and the second coil 202 and the size are not restricted to these. As shown in FIG. 6, the RF coil may be configured so that the distance between the first coil 201 and the second coil 202 may be zero, namely, the first coil 201 and the second coil 202 may be on the same plane. In this case, the size of the second coil 202 shall differ from that of the first coil 201. FIG. 6 illustrates by an example the transmitting/receiving RF coil 114 of the first embodiment in the case where the second coil 202 is larger than the first coil 201. However, the sizes of the both coils may be reverse. Further, as shown in FIG. 7, the RF coil may be configured so that the first coil 201 may be disposed at a point facing the subject through the second coil 202. FIG. 7 illustrates by an example the transmitting/receiving RF coil 114 of the first embodiment in the case where the size of the second coil 202 is made equal to that of the first coil 201.

Moreover, in each of the above-mentioned embodiments, the RF coil was explained taking as an example the case where the RF coil performed both transmission and reception. However, the RF coils explained by the above-mentioned respective embodiments may be used as a transmitting RF coil that only impresses the high frequency magnetic field to the subject 103 or as a receiving RF coil that performs only reception of the RF signals generated from the subject 103, separately.

Moreover, making a reference to nuclides that are objects to be detected, the present invention can be applied to various combinations in addition to the above-mentioned combination of fluoride and hydrogen, for example, a combination of phosphorus and sodium (in the case of 3T, the frequency of an MR signal of phosphorus is 51.6 MHz and the frequency of an MR signal of sodium is 33.9 MHz).

Figure 8:
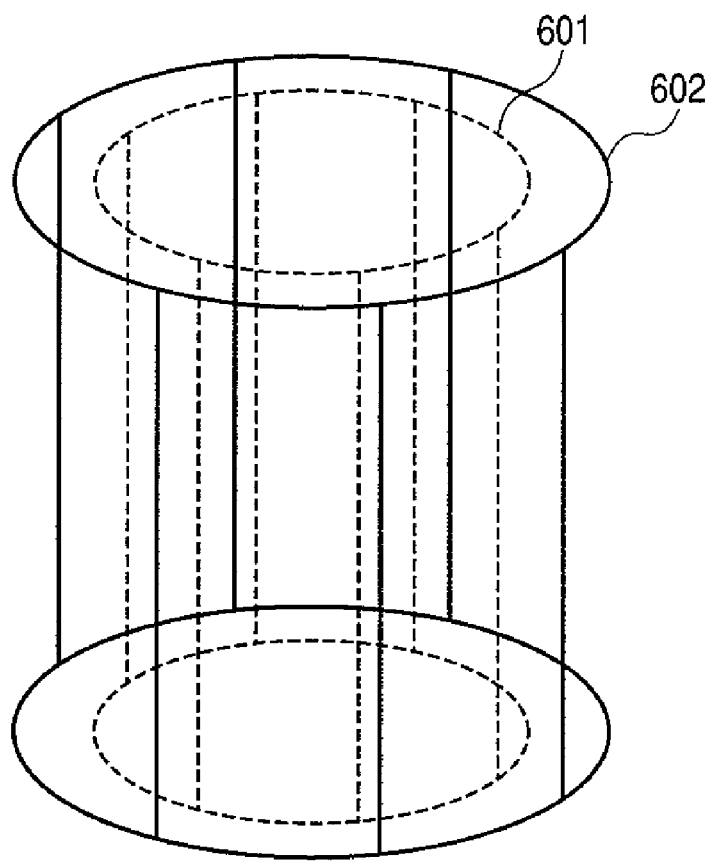
FIG. 8 is a diagram for explaining another form of the transmitting/receiving RF coil of the first and second embodiments.
Figure 9:
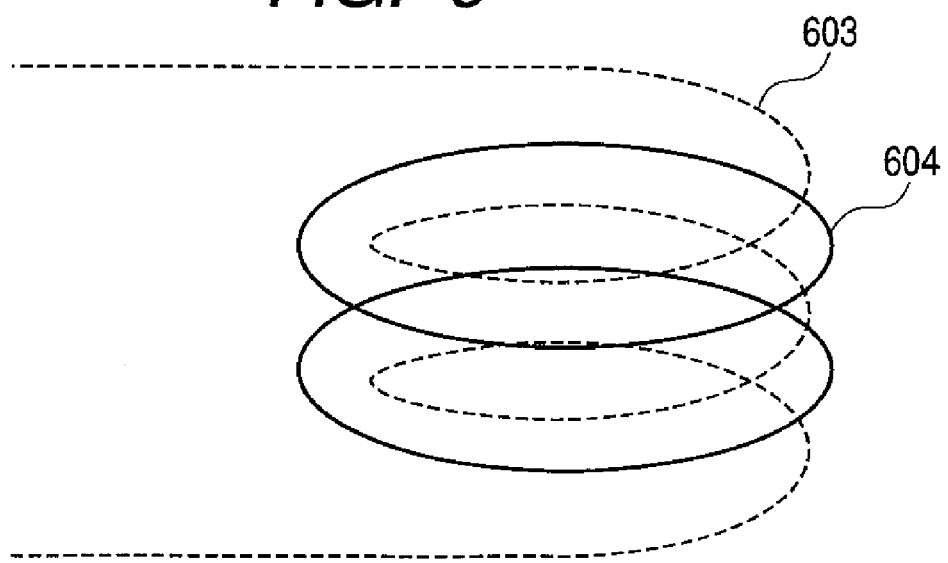
FIG. 9 is a diagram for explaining another form of the transmitting/receiving RF coil of the first and second embodiments.
Figure 10:
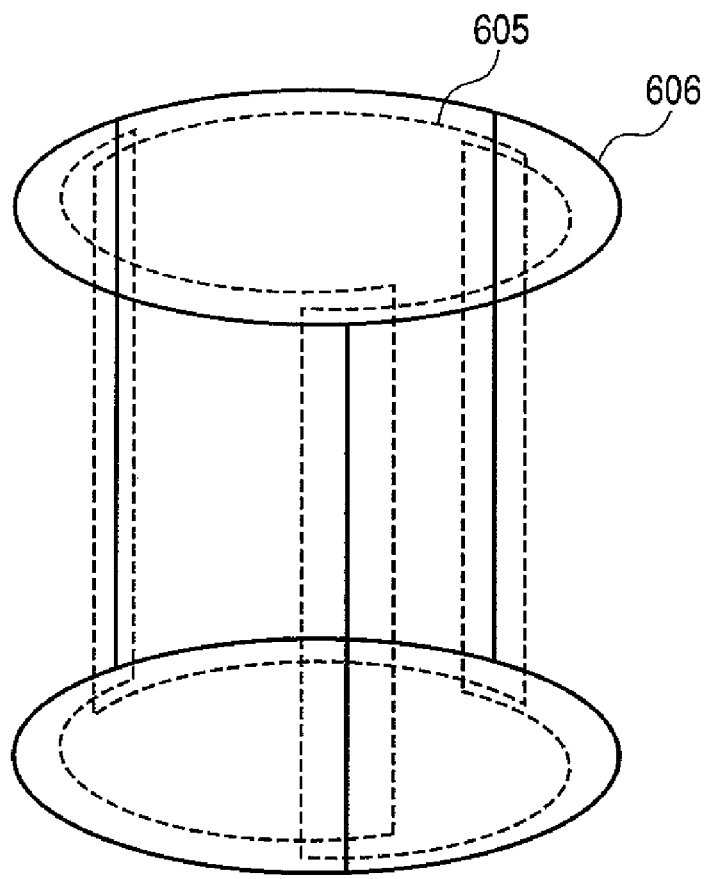
FIG. 10 is a diagram for explaining further another form of the transmitting/receiving RF coil of the first and second embodiments.

Further, in the embodiment described above, although a coil that had a form of a loop coil was explained taking it as an example, a coil in another form may be used. FIG. 8, FIG. 9, and FIG. 10 show examples of a birdcage type coil, a solenoid type coil, and a parallel type coil of three channels, respectively, to each of which the present invention is applied. In each figure, dotted line parts (601, 603, and 605) correspond to the first coil 201, and solid line parts (602, 604, and 606) correspond to the second coil 202, respectively. In any type of coil, by disposing the second coil 202 whose conduction is controllable because of having a switch etc. (not illustrated) at a point at which it causes inductance coupling to the first coil 201, the resonance frequency of the first coil 201 is shifted, so that images of two kinds of nuclides are acquired, respectively.

EXAMPLES

First Example

Hereafter, an example whereby feasibility of the frequency shift (changeover) of a transmitting/receiving RF coil 114 of the first embodiment was verified will be described. In the first example, as the first coil 201 of the transmitting/receiving RF coil 114-1, a multipurpose coil that is normally used in clinical applications is used. In this example, simulation of a frequency characteristic of the first coil 201 was performed in each of the case where the switch 203 was maintained in ON state and the case where the switch 203 was maintained in OFF state, respectively. Specifically, the value of the impedance of the first coil 201 when a frequency of a supply voltage was varied was computed.

Figure 11:
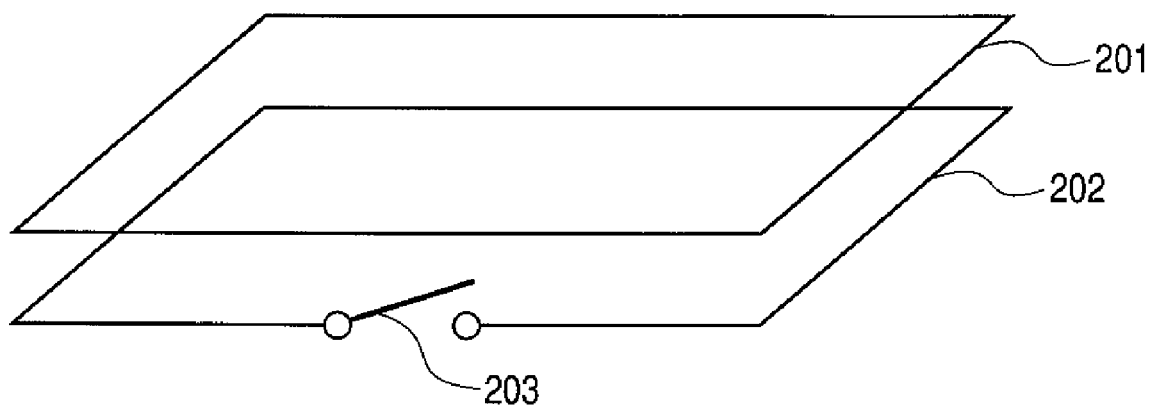
FIG. 11 is an outline configuration diagram of the transmitting/receiving RF coil of a first example.

FIG. 11 shows an outline of the transmitting/receiving RF coil 114-1 of this example. As shown in this figure, the transmitting/receiving RF coil 114-1 of this example is equipped with the first coil 201 that is a multipurpose coil and the second coil 202 of the same form and the same size as the first coil 201. Specifications, such as a size, and circuit configurations of the first coil 201 and the second coil 202 of this example are as follows. The first coil 201 and the second coil 202 are specified to be each a square coil (100 mm×100 mm), and are constructed with copper wire 2.5 mm in radius. Their conductivities are both $5.8 \times 10^7$ S/m. The capacitors were disposed at two points in the first coil 201, and one of them was assigned as a feeding point. The capacitor capacitances were both set to 15 pF. Moreover, in the second coil 202, the resistors were disposed in total four points, one resistor being in each side. A distance between the both coils 201, 202 was set to 21 mm.

In this example, for simplification of the numerical simulation, turning ON and OFF of the switch 203 is reproduced by changing the value of resistance and the capacitor 405 shown in FIG. 4 is also omitted. The ON state of the switch was reproduced by setting the value of resistance to 0Ω; the OFF state of the switch was reproduced by setting the value of resistance to 1 GΩ.

Figure 12:
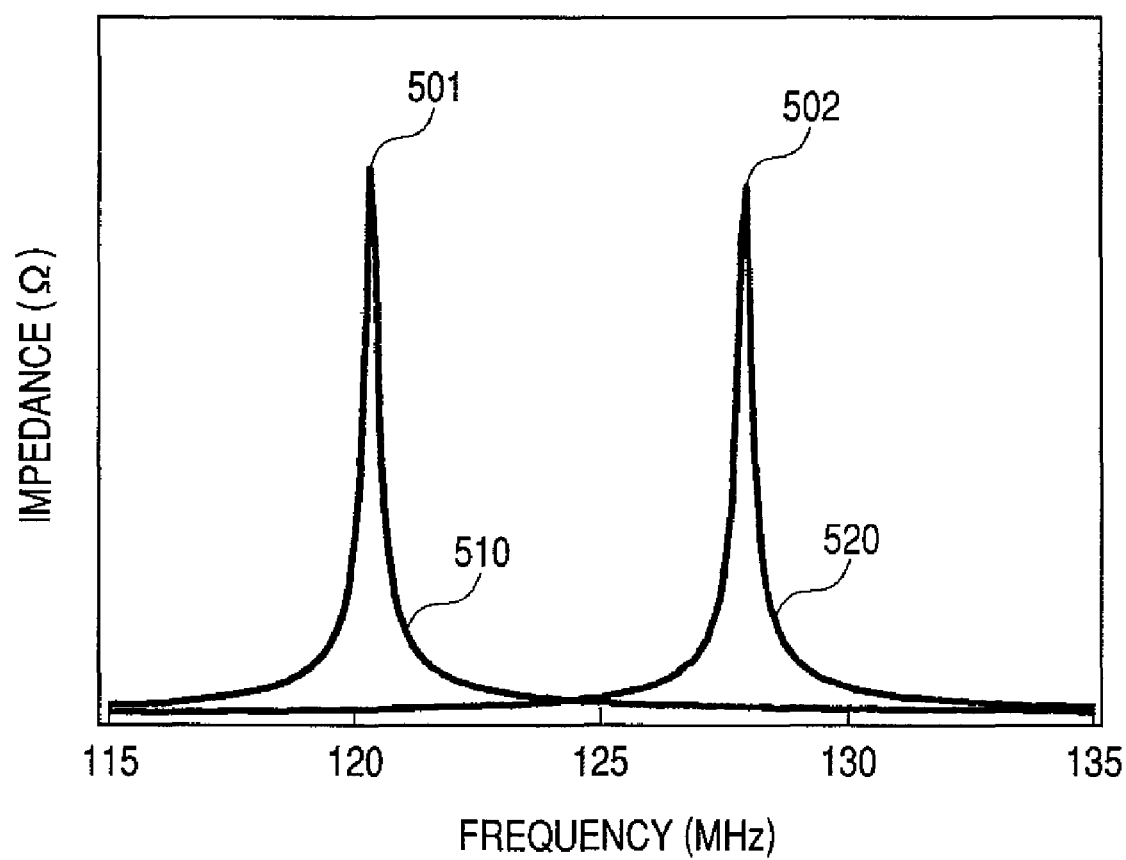
FIG. 12 is a graph of a numerical simulation result of a frequency characteristic of the first coil of the first example.

FIG. 12 is a graph showing situations of change of the impedance to the frequency of the supply voltage of the first coil 201 in ON state and OFF state of the switch 203 of the second coil 202, respectively. The vertical axis of the graph represents the impedance value (Ω) of the first coil 201 and the horizontal axis represents the frequency (MHz) of the supply voltage. A curve 510 shows a change of the impedance of the first coil 201 when the switch 203 of the second coil 202 is OFF; a curve 520 shows a change when the switch 203 of the second coil 202 is ON. Points 501, 502 are respective resonance peaks, i.e., resonance frequencies. Incidentally, the coil has a high sensitivity in the vicinity of the resonance frequency.

This graph shows that the resonance frequency of the first coil 201 can be shifted by ON-OFF of the switch 203 and that the resonance frequency 502 when the switch 203 is in ON state is higher than the resonance frequency 501 when the switch 203 is in OFF state.

Incidentally, in imaging when a magnetic field strength is 3T, the frequency of an MR signal of fluoride becomes 120.3 MHz, and that of hydrogen becomes 127.8 MHz. In FIG. 12, one can understand that the resonance peak 501 agrees with the frequency of the MR signal of fluoride, and the resonance peak 502 agrees with the frequency of an MR signal of hydrogen. That is, it has been shown that it is possible to tune in to the MR signal of each of hydrogen and fluoride by the transmitting/receiving RF coil 114 shown in the first example, and to perform imaging while changing the both signals.

FIG. 12 shows a result in the case where the distance between the first coil 201 and the second coil 202 was set to 21 mm and the sizes of the first coil 201 and the second coil 202 were made equal. However, the shift amount of the resonance frequency of the first coil 201 produced by turning ON and OFF of the switch 203 is dependent on the distance between the first coil 201 and the second coil 202 and a relative size of the second coil 202 to the first coil 201.

Figure 13:
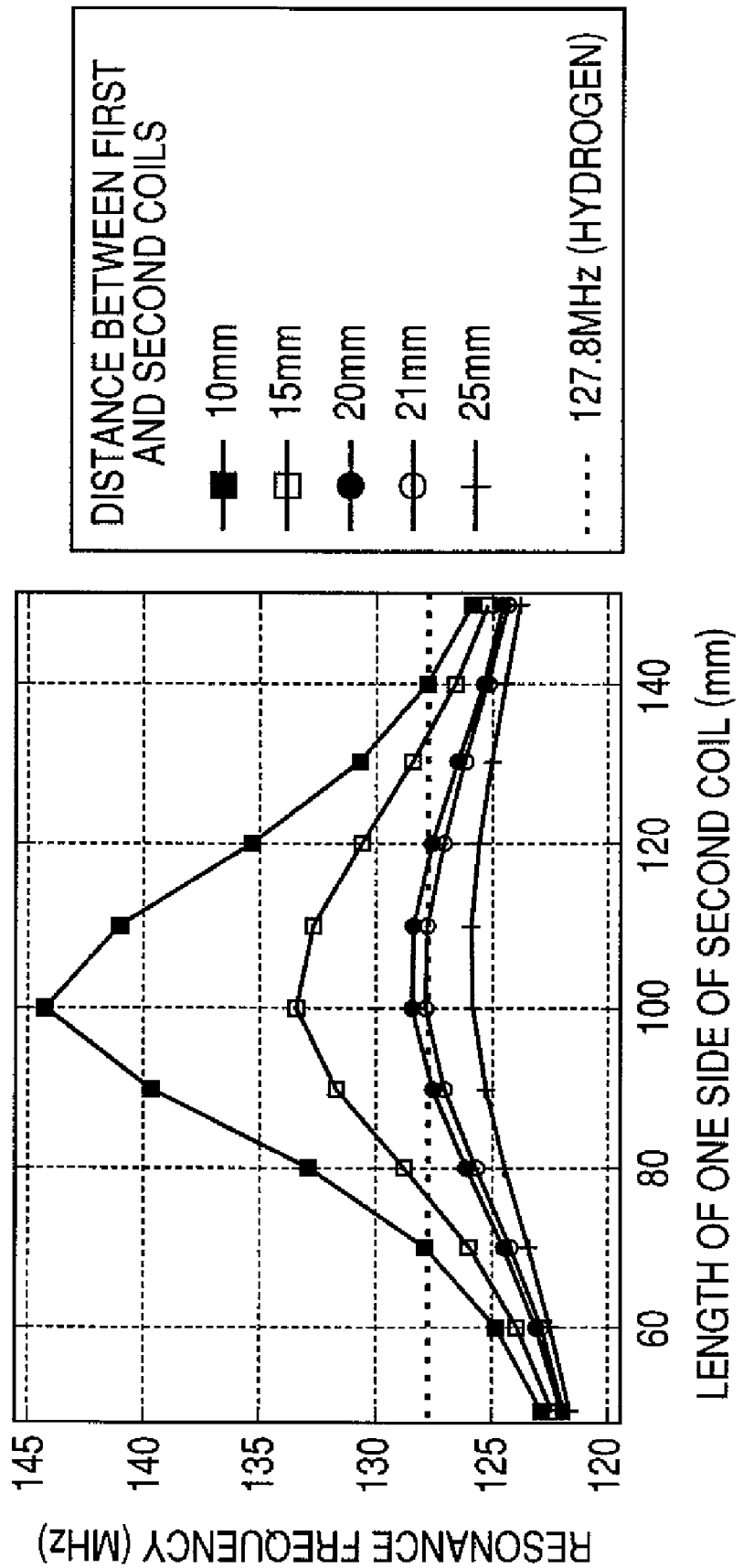
FIG. 13 is a graph of a numerical simulation result of a resonance frequency shift amount of the first coil of the first example.

Then, a change of the shift amount of the resonance frequency when the distance between the first coil 201 and the second coil 202 and the length of one side of the second coil 202 were changed was measured. FIG. 13 shows a graph of the result. The vertical axis of FIG. 13 represents the resonance frequency of the first coil 201 in a state where the switch 203 of the second coil 202 is turned ON, and the horizontal axis represents the length of one side of the second coil 202. The distance between the first coil 201 and the second coil 202 was set to 10 mm, 15 mm, 20 mm, 21 mm, and 25 mm, respectively, and conducts measurement. Incidentally, in a state where the switch 203 is turned OFF, the resonance frequency of the first coil 201 is set to become 120.3 MHz.

First, seeing the distance between the first coil 201 and the second coil 202, it can be understood that the smaller the distance between the both coils, the larger the resonance frequency shift amount becomes. This is because the smaller the distance between the both coils, the larger the effect of inductance coupling becomes. Therefore, in the case where the resonance frequency is shifted by changing only the distance, it is necessary to determine the distance depending on the frequency shift amount that is intended to be realized.

Next, seeing an effect of the size of the second coil 202, it is found that, when the length of one side is in the region of 100 mm, the resonance frequency shift amount becomes a maximum. This size is the same size as that of the first coil 201. It can be said that, when the second coil 202 for changing a frequency is made to be of a comparable size to the first transmitting/receiving coil 201, it performs inductance coupling more efficiently, and as a result, a larger resonance frequency shift amount is realized.

From FIG. 13, it can be said that, when the distance between the first coil 201 and the second coil 202 is smaller, or in the case where the size of the second coil 202 is comparable to that of the first coil 201, a larger resonance frequency shift amount is realizable. Moreover, assuming a case where the distance between the first coil 201 and the second coil 202 cannot be set sufficiently, if a graph in the case of the distance of 10 mm is seen, for example; it can be said that the resonance frequency is shifted to a resonance frequency of 127.8 MHz of hydrogen by setting the length of one side of a square of the second coil 202 to around 70 mm or around 140 mm.

Regarding position of the first coil 201 and the second coil 202, as shown in FIG. 6 described above, it is also possible to dispose the both on the same plane. When disposing on the same plane, it has been verified by numerical simulation that by using the second coil 202 of a square whose side is 145 mm long is used for the first coil 201 of a square whose side is 100 mm long, the resonance frequency can be shifted to that of fluoride of 120.3 MHz to that of hydrogen of 127.8 MHz.

Incidentally, when designing the transmitting/receiving RF coil 114-1, after considering carefully a tendency shown in FIG. 13 in various restrictions in the design, such as the apparatus size and form, the distance between the first coil 201 and the second coil 202 and the sizes of them are determined so that a necessary resonance frequency shift may be realized.

Second Example

Next, a second example will be described. In the second example, it was verified whether imaging by changing the resonance frequencies of fluoride and hydrogen was possible with the above-mentioned second coil 202 for the transmitting/receiving RF coil 114-2 having a size and a structure that were being used in clinical applications to image the trunk part of the body.

Figure 14:
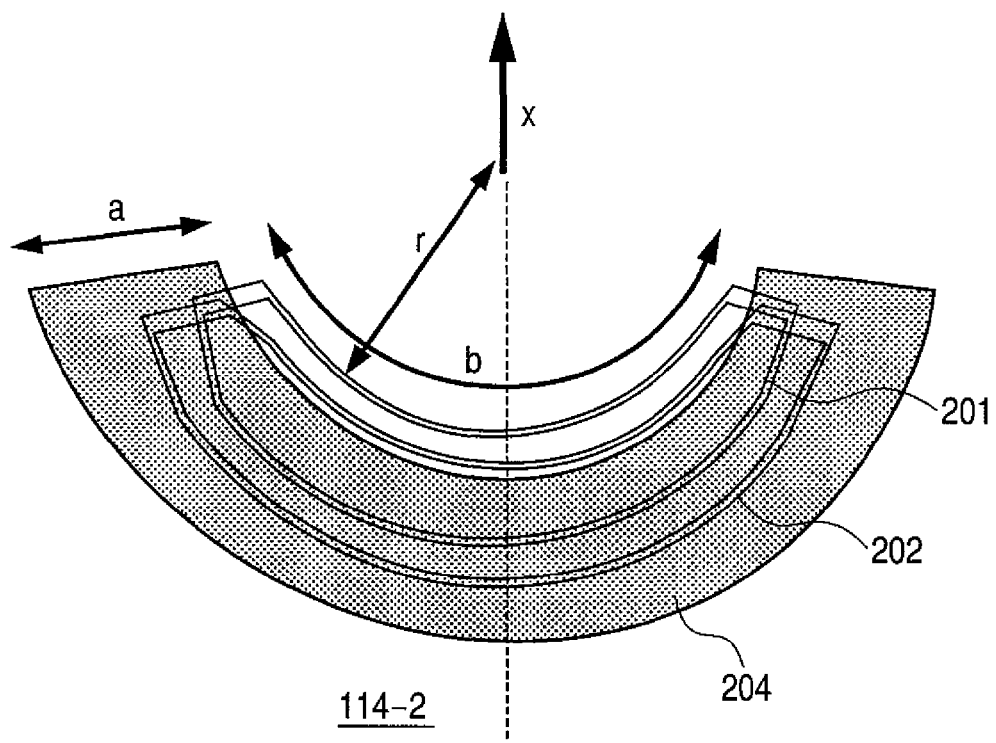
FIG. 14 is an outline configuration diagram of the transmitting/receiving RF coil of a second example.

FIG. 14 shows a configuration example of the transmitting/receiving RF coil 114-2 used in the second example. Here, a coil for imaging the trunk part of the body incorporated in an actual MRI apparatus was used, the switch 203 of the second coil 202 was turned ON and OFF, and the frequency characteristic of the first coil 201 in each state was simulated. Here, a situation closer to actual use is reproduced by placing a shield 204 to the second coil 202 on the other side of the first coil 201. The coil for imaging the trunk part of the body is composed of the first coil 201 and the second coil 202 each having a form of rectangle loop with its corners rounded off and the shield 204 having a form of rectangle plane all of which are bent with a curvature with respect o a certain axis. The switch 203 is not shown in FIG. 14.

Sizes of the first coil 201, the second coil 202, and the shield 204 were specified as follows, where a shorter side (straight part) is represented by a, a longer side (curved part) by b, and the radius of curvature by r, respectively. The first coil 201 has a=450 mm, b=576 mm, and r=250 mm; the second coil 202 has a=450 mm, b=645 mm, and r=280 mm; and the shield 204 has a=600 mm, b=785 mm, and r=305 mm. In addition, the first coil 201 and the second coil 202 are each composed of a flat plane of a ribbon with a width of 20 mm. Regarding a material, all of the first coil 201, the second coil 202, and the plane shield 204 are made of copper (conductivity is $5.8 \times 10^7$ S/m).

Next, a circuit configuration of each coil in this example will be explained briefly. In the first coil 201, three capacitors are disposed in three points of each side, total 12 capacitors being at 12 points, and one point was assigned as the feeding point. A value of the capacitor only at one point that served as the feeding point was fixed to 30 pF, and other 11 points were set to 16.48 pF. Moreover, in the second coil 202, a resistor was disposed at one point of each side, total four resistors being at four points. Note here that the changeover of the switch 203 of the second coil 202 was reproduced by changing the value of resistance like the first example. That is, in the case of switching-on, the value of resistance was set to 0Ω, and in the case of switching-off, the resistance was value set to 1 GΩ, thereby realizing turning ON and OFF of the current.

Figure 15:
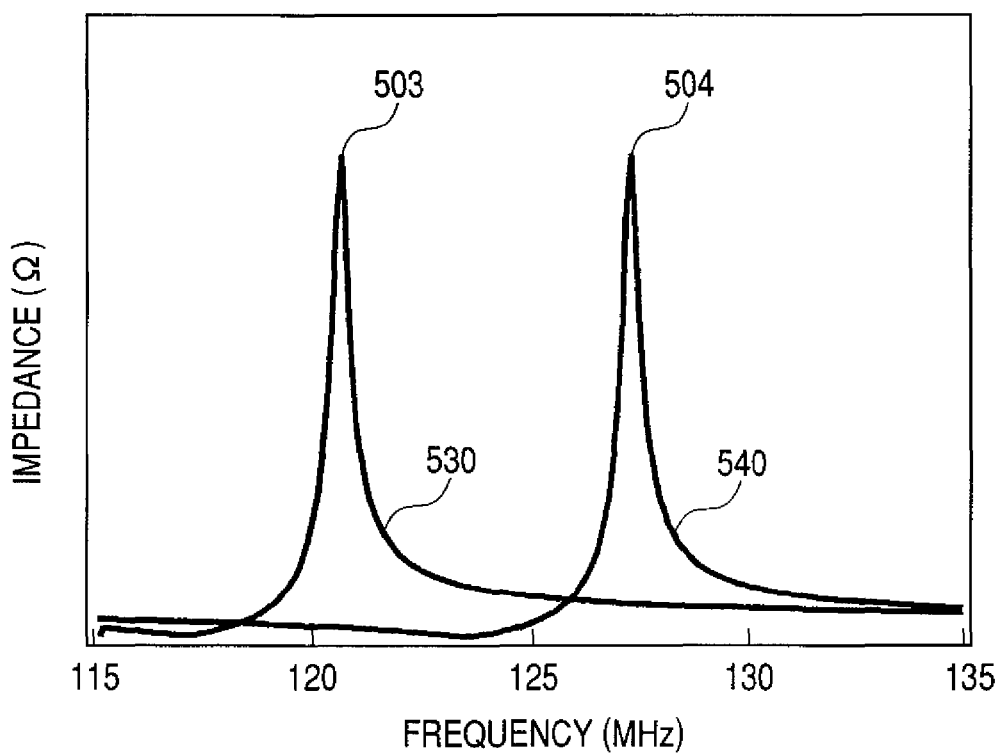
FIG. 15 is a graph of a numerical simulation result of the frequency characteristic of the first coil of the second example.

FIG. 15 shows a result of numerical simulation of the frequency characteristic of the first coil 201 when the switch 203 of the second coil 202 is turned ON and OFF. The vertical axis of the graph represents the impedance value (Ω) of the first coil 201 and the horizontal axis represents the frequency (MHz) of the supply voltage. A curve 530 shows a change of the impedance of the first coil 201 when the switch 203 of the second coil 202 is OFF, and a curve 540 shows the change when the switch 203 of the second coil 202 is ON. Points 503, 504 represent respective resonance peaks of the curves, i.e., resonance frequencies. Incidentally, the each the coil has a high sensitivity near its resonance frequency.

This graph shows that also in this example, the resonance frequency of the first coil 201 can be shifted by turning ON and OFF the switch 203 and the resonance frequency 504 when the switch 203 in ON state is higher than the resonance frequency 503 when the switch 203 is in OFF state. Moreover, similarly with FIG. 12, this graph shows that the RF coil 114-2 can change the resonance frequency peaks 503, 504 to a frequency (120.3 MHz) of the MR signal of fluoride and to a frequency (127.8 MHz) of the MR signal of hydrogen or their vicinities, respectively, by turning ON and OFF the switch 203. This result shows that, even in the case of the transmitting/receiving RF coils 114-2 of a size as that is actually used in clinical applications, being equipped with the second coil 202 shown in the embodiment described above makes it possible to change imaging of a fluoride-hydrogen image.

As described above, the transmitting/receiving RF coil 114-2 of the above-mentioned example can make its resonance frequency resonate with the frequencies of the MR signals of the two kinds of nuclides, fluoride and hydrogen. When putting this RF coil to practical use, sensitivities when imaging fluoride and hydrogen images are also important. Then, a sensitivity distribution when frequency shift is performed with the transmitting/receiving RF coil 114-2 of the above-mentioned example is compared with a sensitivity obtained by a conventionally used technique, as a reference.

As the coil of the conventional technique, a coil (called a conventional coil) that used only one coil and a shield and whose resonance frequency was shifted by adjusting capacitor capacitance was adopted. As the conventional coil, a coil system that was composed of two components, one coil and the shield, was prepared and capacitances of 12 capacitors disposed in the coil part were adjusted so that the coil might have peaks at frequencies of the MR signals of fluoride and hydrogen. Specifically, the capacitance of a capacitor at one point that serves as a feeding point was fixed to 30 pF. The capacitances of capacitors at other 11 points were all set to 16.48 pF when being tuned in to the frequency (120.3 MHz) of the MR signal of fluoride, and were all set to 14.37 pF when being tuned in to the frequency (127.8 MHz) of the MR signal of hydrogen. Incidentally, these values can be predicted to some degree of accuracy based on the above-mentioned formula (1).

On the other hand, the transmitting/receiving RF coil 114-2 of this example comprises three components of the first coil 201, the second coil 202, and the shield 204, and, unlike the conventional coil, the capacitor capacitance of the first coil 201 for detecting the MR signal is not altered between the case of fluoride and the case of hydrogen. Instead, by turning ON and OFF the switch 203 of the second coil 202, the resonance frequency of the first coil 201 is changed. As described above, the switch 203 is turned OFF at the time of fluoride imaging, and the switch 203 is turned ON at the time of hydrogen imaging.

Figure 16A:
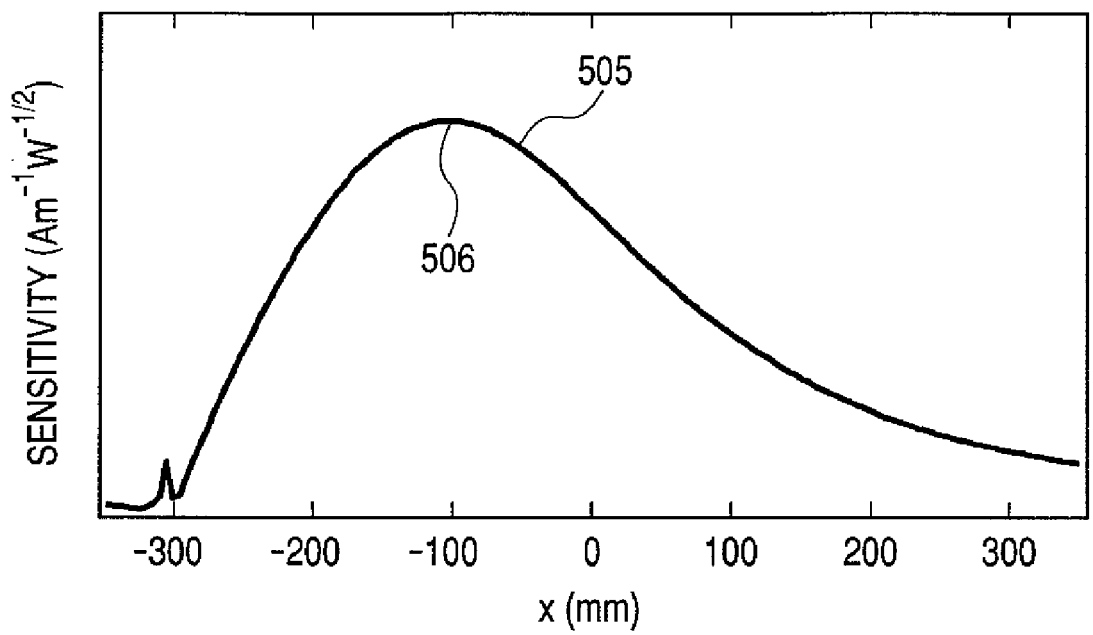
FIG. 16A is a graph showing a comparison result of a sensitivity distribution of the transmitting/receiving RF coil of the second example at the time of fluoride imaging.
Figure 16B:
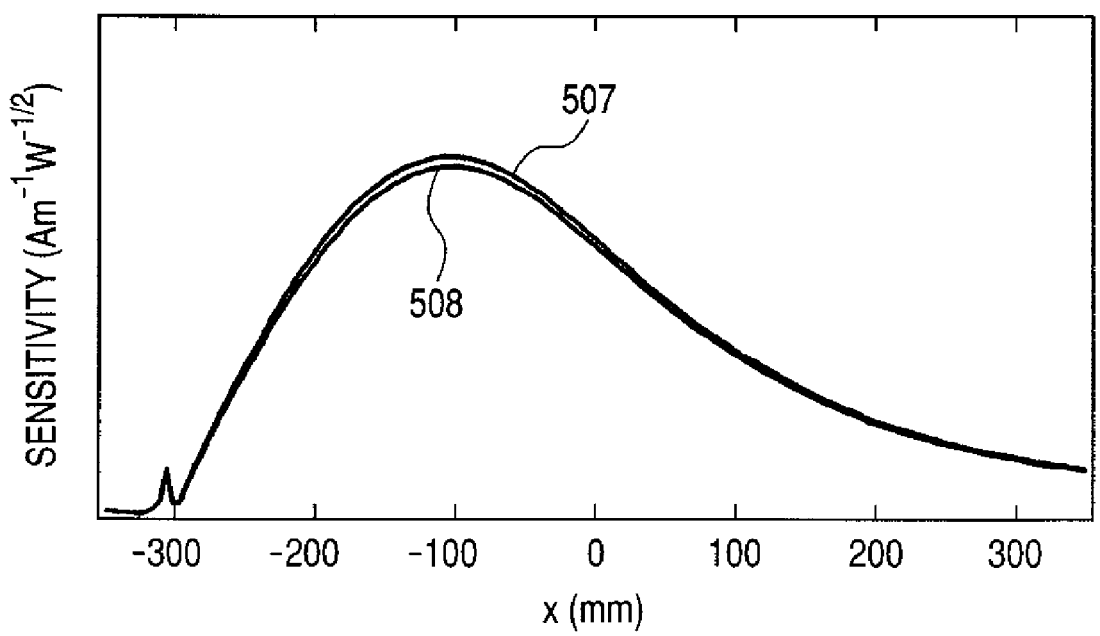
FIG. 16B is a graph showing a comparison result of a sensitivity distribution of the transmitting/receiving RF coil of the second example at the time of hydrogen imaging.

FIG. 16 shows a graph showing a comparison result of the sensitivities formed by the conventional coil and formed by the transmitting/receiving RF coil 114 of this example, respectively. FIG. 16A shows a sensitivity distribution 505 of the conventional coil and a sensitivity distribution 506 of the transmitting/receiving RF coil 114 of this example at the time of fluoride imaging, where the vertical axis represents the sensitivity distribution ($Am^{-1}W^{-1/2}$) and the horizontal axis represents the x-axis (mm) in FIG. 14. Incidentally, a point x=−305 mm corresponds to a point of the shield 204, x=−280 mm to a point of the second coil 202, and x=−250 mm to a point of the first coil 201: the larger the value of x, the larger the distance from a coil surface becomes. FIG. 16B shows similarly sensitivity distributions 507, 508 of the conventional coil and of the coil of this example at the time of hydrogen imaging.

As shown in FIG. 16A, at the time of fluoride imaging, the sensitivity distribution 505 of the conventional coil nearly agrees with the sensitivity distribution 506 of the coil of this example. That is, the coil of this example shows that the sensitivity does not fall compared with the case of the conventional coil at the time of fluoride imaging. This indicates that the second coil 202 with which the coil of this example is equipped does not exert a harmful influence on the sensitivity distribution formed by the first coil 201.

On the other hand, at the time of hydrogen imaging, as shown in FIG. 16B, the sensitivity distribution 508 of the coil of this example can be described to be nearly the same distribution as the sensitivity distribution 507 of the conventional coil, but in the vicinity of x=−100 mm, the sensitivity value becomes smaller slightly. This is considered to be due to an influence that the switch 203 of the second coil 202 was turned ON. However, a ratio of lowering of the sensitivity value of the coil of this example at x=−100 mm is 2.7%, and can be said to have little influence on quality of an image provided that the ratio remains at this value or so.

From the above result, it has been shown that the coil of this example can perform imaging of both fluoride and hydrogen with nearly the same sensitivity as that of the conventional coil having a single resonance frequency. Note that with the coil of this example, fluoride-hydrogen imaging can be switched within several µs only by turning ON and OFF the switch.

With the coil of this example, in the case where a specific site is observed, for example, using a contrast medium containing fluoride, the following effects can be obtained: when the contrast medium is intended to be visualized (fluoride image), imaging can be performed with the same sensitivity as that of the single resonance frequency coil; and when a structure of body tissue is intended to be visualized (hydrogen image), imaging can be performed with nearly the same sensitivity as that of a coil having a single resonance frequency. In addition, in the case where imaging of fluoride-hydrogen needs to be changed over a plurality of times, imaging van be performed by changing the two nuclides within several µs.

What is claimed is:

1. A high frequency magnetic field coil of a magnetic resonance imaging apparatus whose resonance frequency is a magnetic resonant frequency of a first nuclide, comprising:
    a sub coil disposed at a point at which it can instantaneously inductively couple with the high frequency magnetic field coil; and
    a conduction control unit that controls conduction of the sub coil,
    wherein, at a time of the conduction, the sub coil instantaneously inductively modifies the resonance frequency of the high frequency magnetic field coil to be a magnetic resonant frequency of a second nuclide that has a higher magnetic resonant frequency than the magnetic resonant frequency of the first nuclide,
    wherein, at a time of no conduction, the resonance frequency of the high frequency magnetic field coil also instantaneously reverts to the resonant frequency of the first nuclide, and
    wherein the magnetic resonance imaging apparatus is capable of performing plural nuclide imaging over the entire area of the subject with only the high frequency magnetic field coil being resonant.

2. The high frequency magnetic field coil according to claim 1, wherein the sub coil is disposed at a point facing a subject through the high frequency magnetic field coil.

3. The high frequency magnetic field coil according to claim 1, wherein the sub coil is disposed in the same plane as that of the high frequency magnetic field coil.

4. The high frequency magnetic field coil according to claim 1, wherein the sub coil is disposed between a subject and the high frequency magnetic field coil.

5. The high frequency magnetic field coil according to claim 1, wherein the sub coil is electrically non-connected with the high frequency magnetic field coil.

6. The high frequency magnetic field coil according to claim 1, wherein the sub coil modifies the resonance frequency of the high frequency magnetic field coil to be the magnetic resonant frequency of the second nuclide by adjusting at least one element out of the disposed point and a size of the sub coil.

7. The high frequency magnetic field coil according to claim 1, wherein the first nuclide is fluoride and the second nuclide is hydrogen.

8. The high frequency magnetic field coil according to claim 1, wherein the conduction control unit is a switch.

9. The high frequency magnetic field coil according to claim 8, wherein the switch consists of a diode and an inductor.

10. The high frequency magnetic field coil according to claim 8, wherein the switch is based on a micro-electromechanical system.

11. The high frequency magnetic field coil according to claim 1, wherein the conduction control unit is a variable resistor.

12. A magnetic resonance imaging apparatus, comprising:
    a static magnetic field formation unit that forms a static magnetic field;
    a gradient magnetic field formation unit that forms a gradient magnetic field;
    a high frequency magnetic field formation unit that forms a high frequency magnetic field;
    a transmitting/receiving coil that irradiates the high frequency magnetic field on a subject and detects magnetic resonance signals generated from the subject, the resonance frequency of the transmitting/receiving coil being the same as a magnetic resonant frequency of a first nuclide;
    a reception unit that receives the magnetic resonance signals;
    a control unit that controls the gradient magnetic field formation unit, the high frequency magnetic field formation unit, and the reception unit;
    a sub coil disposed at a point at which it can instantaneously inductively couple with the high frequency magnetic field coil; and
    a conduction control unit that controls conduction of the sub coil,
    wherein, at a time of the conduction, the sub coil instantaneously inductively modifies the resonance frequency of the high frequency magnetic field coil to be a magnetic resonant frequency of a second nuclide that has a higher magnetic resonant frequency than the magnetic resonant frequency of the first nuclide,
    wherein, at a time of no conduction, the resonance frequency of the high frequency magnetic field coil also instantaneously reverts to the resonant frequency of the first nuclide, and
    wherein the magnetic resonance imaging apparatus is capable of performing plural nuclide imaging over the entire area of the subject with only the high frequency magnetic field coil being resonant.

13. A magnetic resonance imaging apparatus, comprising:
    a static magnetic field formation unit that forms a static magnetic field;
    a gradient magnetic field formation unit that forms a gradient magnetic field;
    a high frequency magnetic field formation unit that forms a high frequency magnetic field;
    a transmitting coil that irradiates the high frequency magnetic field on a subject;

a receiving coil that detects magnetic resonance signals generated from the subject;
a reception unit that receives the magnetic resonance signals; and
a control unit that controls the gradient magnetic field formation unit, the high frequency magnetic field formation unit, and the reception unit,
wherein the transmitting coil or the receiving coil is a high frequency magnetic field coil, whose resonance frequency is a magnetic resonant frequency of a first nuclide and includes a sub coil having a conduction control unit that controls conduction thereof,
wherein the sub coil is disposed at a point at which it can instantaneously inductively couple with the high frequency magnetic field coil,
wherein, at a time of the conduction, the sub coil instantaneously inductively modifies the resonance frequency of the high frequency magnetic field coil to be a magnetic resonant frequency of a second nuclide that has a higher magnetic resonant frequency than the magnetic resonant frequency of the first nuclide,
wherein, at a time of no conduction, the resonance frequency of the high frequency magnetic field coil also instantaneously reverts to the resonant frequency of the first nuclide, and
wherein the magnetic resonance imaging apparatus is capable of performing plural nuclide imaging over the entire area of the subject with only the high frequency magnetic field coil being resonant.

14. The magnetic resonance imaging apparatus according to claim 12, wherein the control unit controls the conduction control unit of the high frequency magnetic field coil, and controls at least one of the high frequency magnetic field formation unit and the reception unit depending on the control result.

15. The magnetic resonance imaging apparatus according to claim 13, wherein the control unit controls the conduction control unit of the high frequency magnetic field coil, and controls at least one of the high frequency magnetic field formation unit and the reception unit depending on the control result.

16. The magnetic resonance imaging apparatus according to claim 14, wherein the control unit maintains information of specifying the second nuclide, and when instructing conduction to the conduction control unit, controls at least one of the high frequency magnetic field formation unit and the reception unit so that it may perform processing by obtaining the magnetic resonance signal from the second nuclide.

* * * * *